United States Patent
Cranford, Jr. et al.

(10) Patent No.: US 7,305,571 B2
(45) Date of Patent: Dec. 4, 2007

(54) POWER NETWORK RECONFIGURATION USING MEM SWITCHES

(75) Inventors: Hayden C. Cranford, Jr., Cary, NC (US); Louis Lu-Chen Hsu, Fishkill, NY (US); James S. Mason, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 10/940,543

(22) Filed: Sep. 14, 2004

(65) Prior Publication Data

US 2006/0056128 A1    Mar. 16, 2006

(51) Int. Cl.
*G06F 1/00* (2006.01)
*G06F 1/32* (2006.01)
*H02M 3/335* (2006.01)

(52) U.S. Cl. .................. 713/300; 713/320; 363/21.01
(58) Field of Classification Search ................ 713/300, 713/320; 363/20.01, 50; 327/544
See application file for complete search history.

(56) References Cited

U.S. PATENT DOCUMENTS

| | | | |
|---|---|---|---|
| 5,808,527 A * | 9/1998 | De Los Santos | 333/205 |
| 5,834,975 A | 11/1998 | Bartlett et al. | 330/278 |
| 5,943,223 A | 8/1999 | Pond | 363/21 |
| 6,037,719 A | 3/2000 | Yap et al. | 315/169.3 |
| 6,160,230 A | 12/2000 | McMillan et al. | 200/181 |
| 6,429,755 B2 | 8/2002 | Speidell et al. | 333/197 |
| 6,580,947 B1 * | 6/2003 | Thompson | 607/30 |
| 6,833,597 B2 * | 12/2004 | Blasko, III | 257/415 |
| 7,091,765 B2 * | 8/2006 | Bilak et al. | 327/199 |
| 2004/0012469 A1 | 1/2004 | Huang | 333/78 |

OTHER PUBLICATIONS

STMicroelectronics, Dual Action RF-MEMS Switch Suits System-on-Chip Integration, Jul. 21, 2003, p. 2.*
Heydt et al, an NSF/ONR Funded Project on the use of Micromechanical Machines in a Power Circuit Breaker, Jul. 2003, IEEE, vol. 1, pp. 101-102.*
Mihailovich et al, MEM Relay for Reconfigurable RF Circuits, Feb. 2001, IEEE, vol. 11, No. 2, pp. 53-55.*

* cited by examiner

*Primary Examiner*—Suresh K Suryawanshi
(74) *Attorney, Agent, or Firm*—Joscelyn G. Cockburn; William N. Hogg; Driggs, Hogg & Fry Co., LPA

(57) ABSTRACT

A structure and method for power distribution to a network for an integrated circuit chip complex are provided. The chip complex has at least two sectors, each having at least one power providing connection with at least one of said connections beings individually addressable by, and isolatable from, a given power source. At least one MEMS is positioned to selectively connect and disconnect said at least one connection to and from said given power source.

7 Claims, 7 Drawing Sheets

Fig.11

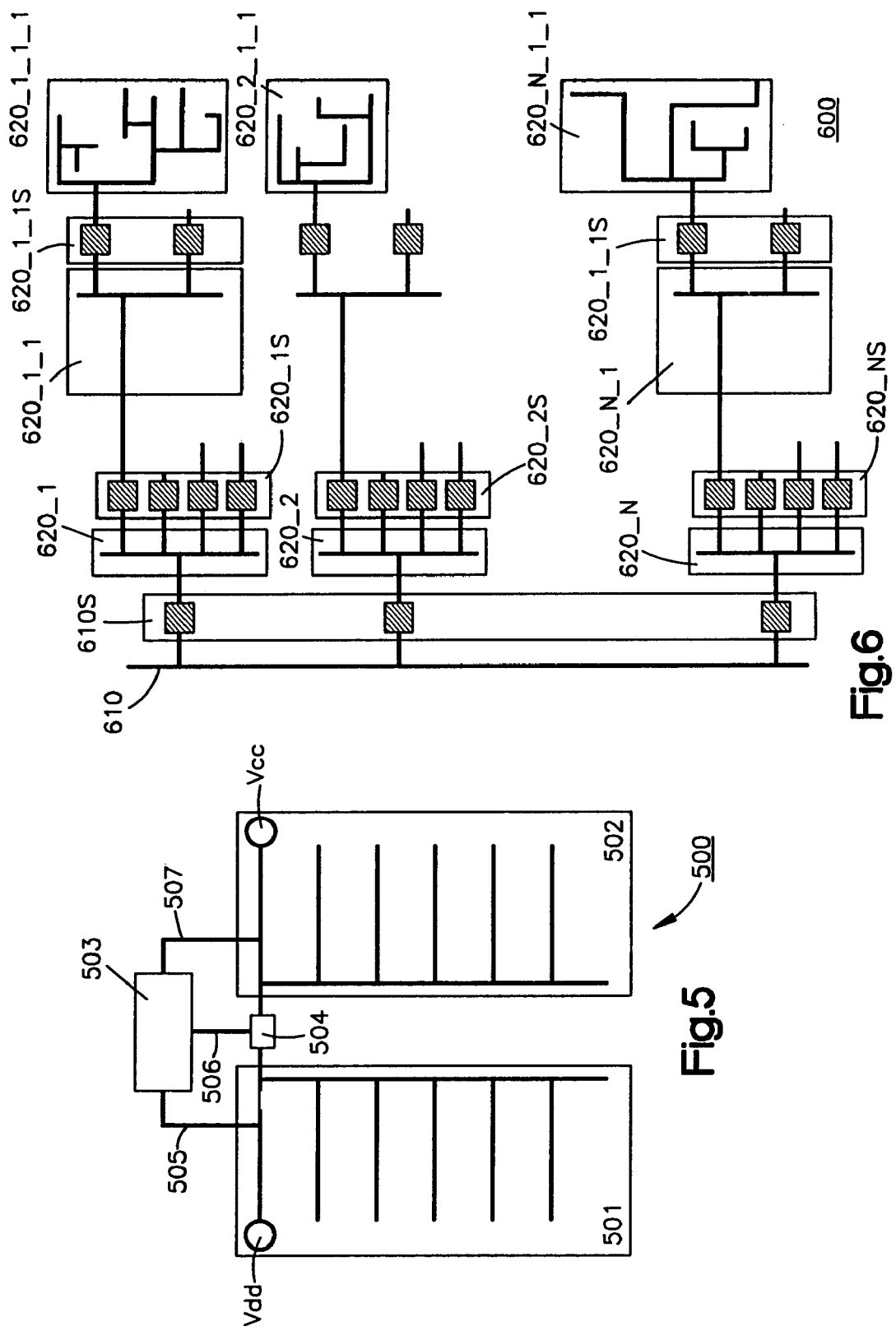

POWER NETWORK RECONFIGURATION USING MEM SWITCHES

FIELD OF THE INVENTION

This invention relates generally to reconfiguration of power networks of integrated circuit (IC) chip complexes using MEMS (microelectricalmechanical switch) to selectively switch power to selected portions of the chip complex.

BACKGROUND OF THE INVENTION

A robust power distribution network both for chips and packages is one of the critical tasks in integrated circuit (IC) design. As Moore's law continues to hold sway, more and more devices and circuits can be packed on a single chip. In the meantime, the silicon chip size also grows to accommodate the capability of multi-system integration. Furthermore, the required supply voltage is progressively reduced from one generation to another in order to save power. One conventional power mesh method (described in U.S. Pat. No. 6,480,989 incorporated herein by reference) to form a power supply distribution network begins to face a tremendous challenge. It can no longer guarantee a predetermined voltage level at all corners of the chip. In other words, the inevitable I*R voltage drop on the supply is known to cause problems, such as slew rate, duty cycle, jitter, timing, etc. to be out of control. This impact has caused both high-speed analog and digital circuits to miss their performance targets and fail the specification. One possible solution is to use low Vt devices to gain back some over-drivability; however, this is achieved at a cost of high power consumption which is undesirable.

Therefore, a more intelligent power distribution network is urgently needed for today's very large scale IC chips or chip complexes. The concept of programmable power distribution network has never been proposed on the semiconductor chip, but only on utility service provided for residences and commercial buildings (U.S. Pat. No. 6,341,054). One possible reason that this concept has not been implemented on the chip is lack of an efficient switch means which can easily be integrated with an IC chip to do the job. There are many disadvantages of using semiconductor devices, either MOS or bipolar, for power switching. The device has certain on state resistance, and off state leakage. One example to use such a switch to detect and isolate the shorts on the supply of a chip has been proposed and described (U.S. Pat. No. 6,320,400).

Some techniques regarding the design of a power distribution network to reduce delta-I noise or increase electromigration resistance can be found in the following patents (U.S. Pat. Nos. 5,694,329, 6,483,435, 6,335,494, 6,061,609). So far, none of them has mentioned to use MEMS for designing a robust on-chip power distribution network.

On the other hand, MEM switch development and on-chip integration schemes have become more and more mature. These can be found in the following US Patent references:
1. Method for constructing an encapsulated MEMS band-pass filter for integrated circuits—U.S. Pat. No. 6,429,755
2. Encapsulated MEMS band-pass filter for integrated circuits and method of fabrication thereof—U.S. Pat. No. 6,399,406
3. Capacitive microelectromechanical switches—U.S. Pat. No. 6,394,942
4. Low actuation voltage microelectromechanical device and method of manufacture—U.S. Pat. No. 6,143,997
5. Micro electromechanical RF switch—U.S. Pat. No. 5,578,976
6. Capacitive Microelectromechanical Switches—U.S. Pat. No. 6,452,124.

However, where MEMS have been used, such switches have been used for signal propagation, not in applications involving power to the chips.

SUMMARY OF THE INVENTION

According to the present invention, a structure and method for power distribution to a network for an integrated circuit chip complex is provided. The chip complex has at least two sectors, each having at least one power providing connection with at least one of said connections beings individually addressable by, and isolatable from, a given power source. At least one MEMS (microelectromechanical switch) is positioned to selectively connect and disconnect said at least one connection to and from said given power source. Therefore, the main object of the invention is to integrate low-voltage MEM switches in CMOS circuits for power supply reconfiguration. Many new applications can be evolved from this objective, some of which will be elaborated below:

BRIEF DESCRIPTION OF THE DRAWINGS

FIG. 5 shows the use of a MEM switch for the application shown in FIGS. 4A and 4B;

FIG. 6 shows MEM switches used for hierarchical power control;

DETAILED DESCRIPTION OF THE PREFERED EMBODIMENT(S)

A method and structure of using microelectromechanical switches (sometimes referred to as MEMS or MEM switches) to achieve power network reconfiguration is provided. This includes: (1) temporarily sharing power supply during a test mode; (2) isolating power supply on unwanted or deactivated circuit blocks so as to avoid noise cross-contamination, or to measure standby (Iddq) leakage; (3) conducting pin reconfiguration between different operating modes, and (4) improving power supply uniformity on an existing power distribution network. Ultimately, this means providing a more sophisticated and "intelligent" power supply network to ensure power supply uniformity. Although the examples given in this application are about improving uniformity of on-chip power supply, the same concepts can be extended to the package level.

There are many advantages of using integrated MEM switches for the above mentioned applications. In general, unlike semiconductor switches, a MEM switch renders low insertion loss when it is "on", and almost no leakage when it is "off". The resulting switch size can be much smaller than that of semiconductor switches. Besides, it requires minimum power to handle the switching activities. However, not all MEM switches are suitable for such applications. Some require higher operating voltage than practical and some are hard to be integrated on the chip.

Figure 1A:
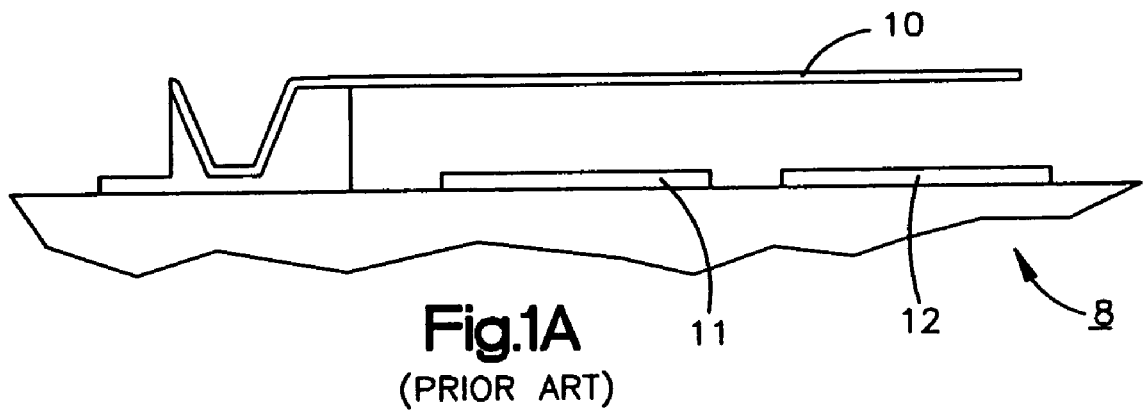
FIGS. 1A through 3C show types of MEM switches in the "on/off" position.
Figure 1B:
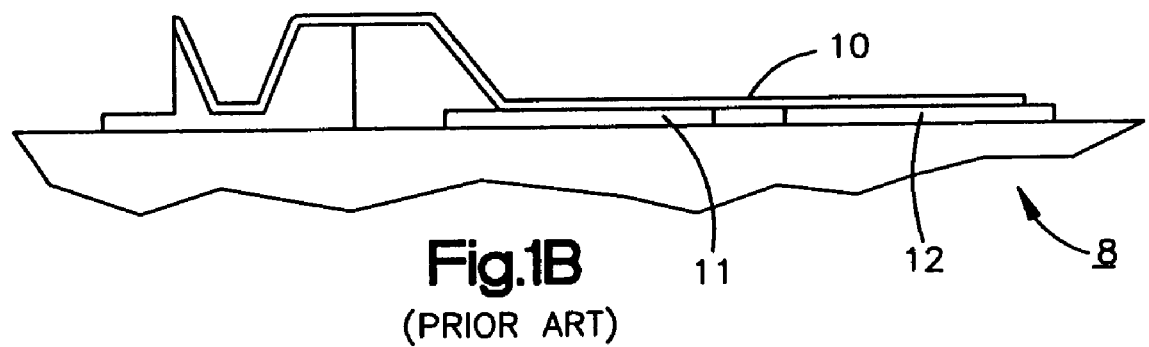

At least three types of MEM switches have been disclosed in the prior art. A cantilever type MEM switch 8 is illustrated in FIGS. 1A and 1B. When an electrostatic force is applied to beam 10, the beam 10 is forced to move lower from the open position shown in FIG. 1A and cause the switch to close on contacts 11, 12 as shown in FIG. 1B.

Figure 2A:
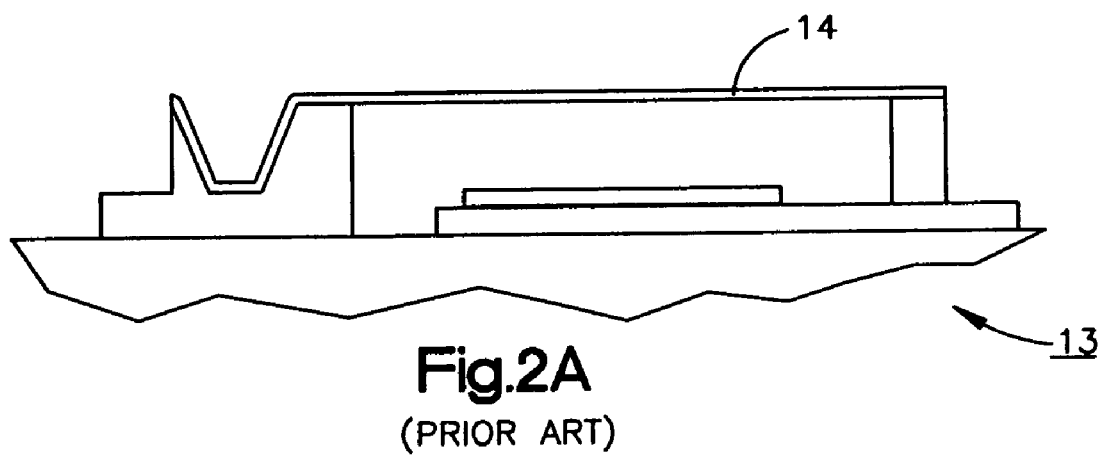
Figure 2B:
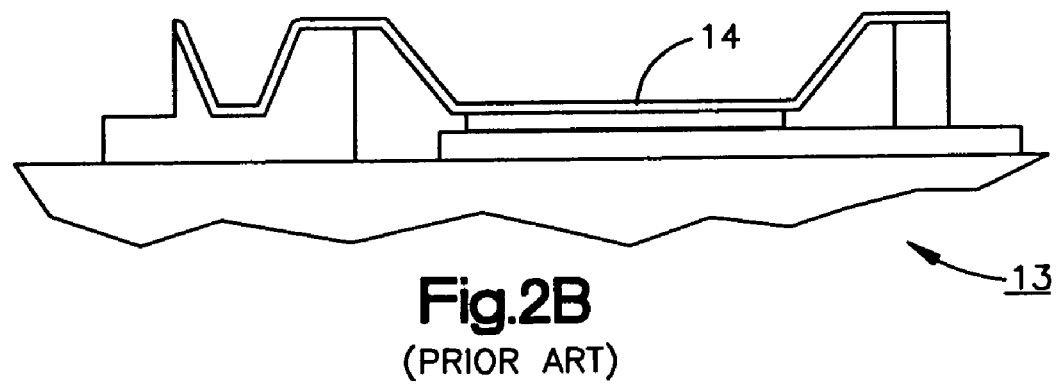

A membrane type switch 13 is shown in FIGS. 2A and 2B. The central portion 14 of the switch is moved up or down by electrostatic force to achieve "on" FIG. 2B or "off" FIG. 2A switching mechanism.

Figure 3A:
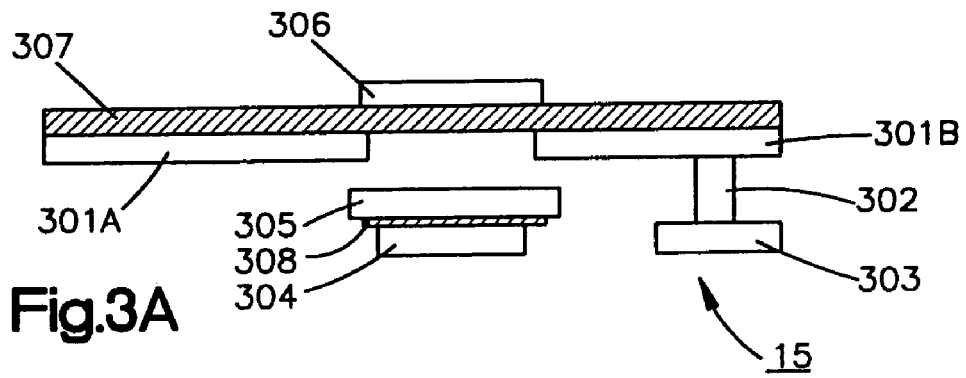
Figure 3B:
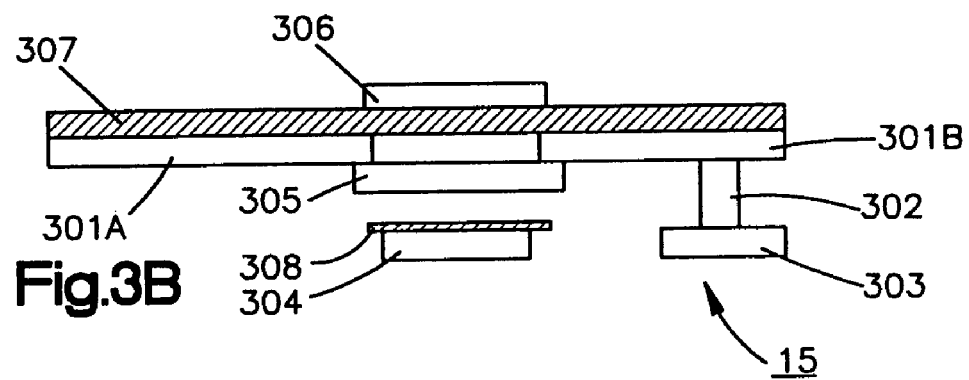
Figure 3C:
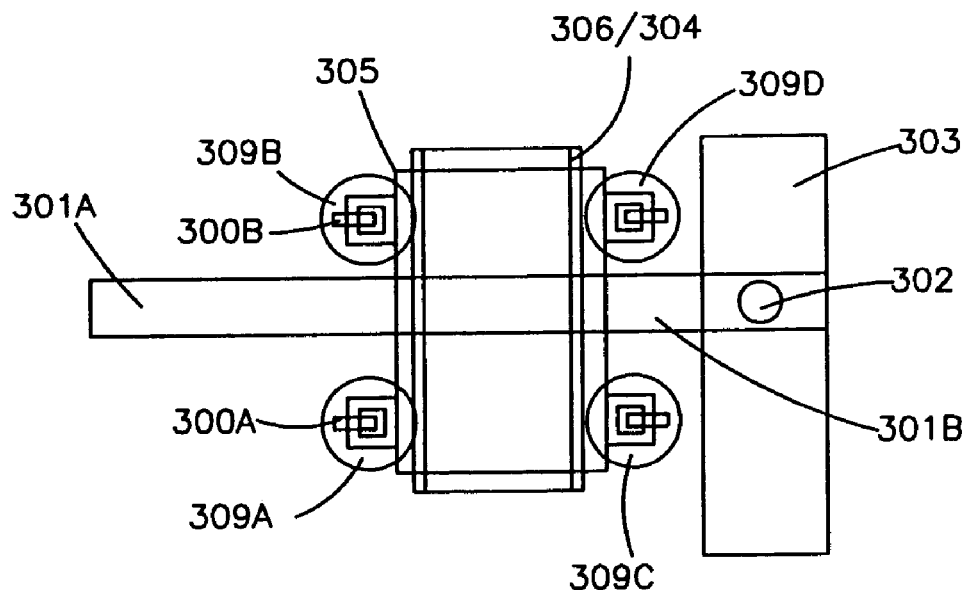

Finally, a hinge type MEM switch 15 is shown in FIGS. 3A-3C comprised of a post 300 and hinge portion 309 to allow switching piece 305 to move freely down as shown in FIG. 3A in an "off" position to that in FIG. 3B in an "on" position with less effort. While in the "on" position, switch plate 305 forms a short between contacts 301A and 301B. While in the "off" position, contacts 301A and 301B are "open". Comparison of various characteristics of these three types of MEMS which illustrates their pros and cons are summarized in Table I:

TABLE I

| | CANTILEVER (ROCKWELL) | MEMBRANE (TI) | HINGE TYPE (UIUC) |
|---|---|---|---|
| FREQUENCY (GH$_z$) | 4 | 20~35 | 50 |
| RON (Ω) | N/A | 0.35 | 0.3 |
| COFF (pF) | N/A | 35 | 30 |
| CUTOFF FREQUENCY (GHz) | N/A | >9,000 | >10,000 |
| INSERTION LOSS (dB) | 0.1 | 0.14~0.17 | 0.2 |
| ISOLATION (dB) | 50 | 24~35 | 30 |
| CAPACITANCE RATIO | N/A | 80~110 | ~100 |
| SWITCHING SPEED (μs) | 30 | <2 | 2 |
| SWITCHING VOLTAGE (V) | 28 | 30~50 | <3 |
| SIZE (μm$^2$) | (200 × 200) × 2 | 280 × 170 | 450 × 100 450 × 150 |

From these characteristics, it is clear that the hinge type MEMS is most attractive. It requires the least switching voltage. Unlike the others, the hinge type MEM switch can switch on and off more freely without mechanical bending. The actuation voltage (less than 3V) is compatible with today's CMOS technologies.

Implementing MEM switches for power distribution network has many advantages such as: (1) low insertion loss, (2) consumes no DC Power, (3) has high linearity, and (4) has broad bandwidth performance. But with today's technology, it should be a low actuation-voltage switch. As mentioned previously, the conventional cantilever type or membrane type switch requires 10 to 100 V operating voltage which is usually not suitable for integration with today's state-of-the-art integrated circuits. In contrast, by using a hinge type MEM switch, no mechanical bending action is needed, and it requires very low actuation voltage (less than 3V). Prior art, U.S. Pat. No. 6,143,997, describes this type of switch. The switch pad moves up and down freely along hinge brackets. In a relaxed state, the pad is attracted by a lower electrode, so it stays at the bottom level (FIG. 3A). In an excited state, the pad is attracted by the top electrode and so it moves to the top level (FIG. 3B).

To build a hinge type MEM switch to selectively make link between one power bus 303 to another 301 is described with reference to FIGS. 3A-3C, which show an open position (FIG. 3A) and a closed position (FIG. 3B) of a hinge type MEM switch. Switch pad 305 has four hinge brackets 309A-309D. When at the relaxed state, the top metal 301A and lower metal 303 are disjointed or separated. When in the excited state, they are touching and, thus, shorted to each other. There are many arrangements and layouts to form such power regulation switches, which are not excluded by this disclosure.

A first embodiment is a power steering switch device comprising at least one MEM switch component, so that during an early test mode, when one power supply is not available, the circuits and devices attached to that power supply can still be tested by borrowing power from another available power supply source. After testing and packaging, the MEM switch is turned off to completely isolate two power supply sources. In the past, MOS switches called "T-switches" were used to achieve this purpose. But, due to limited on-current capability, a large-size MOS switch is usually needed. There are many problems encountered with the T-switch which will be described in more detail infra. Two examples of T-switches are shown in FIGS. 4A and 4B.

Figure 4A:
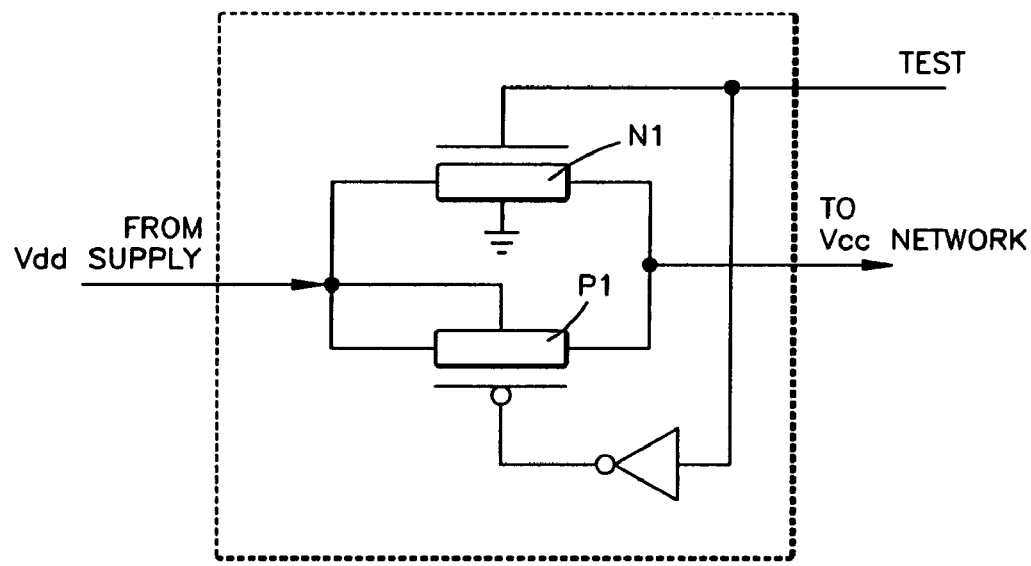
FIGS. 4A and 4B show CMOS T-switch circuits.
Figure 4B:
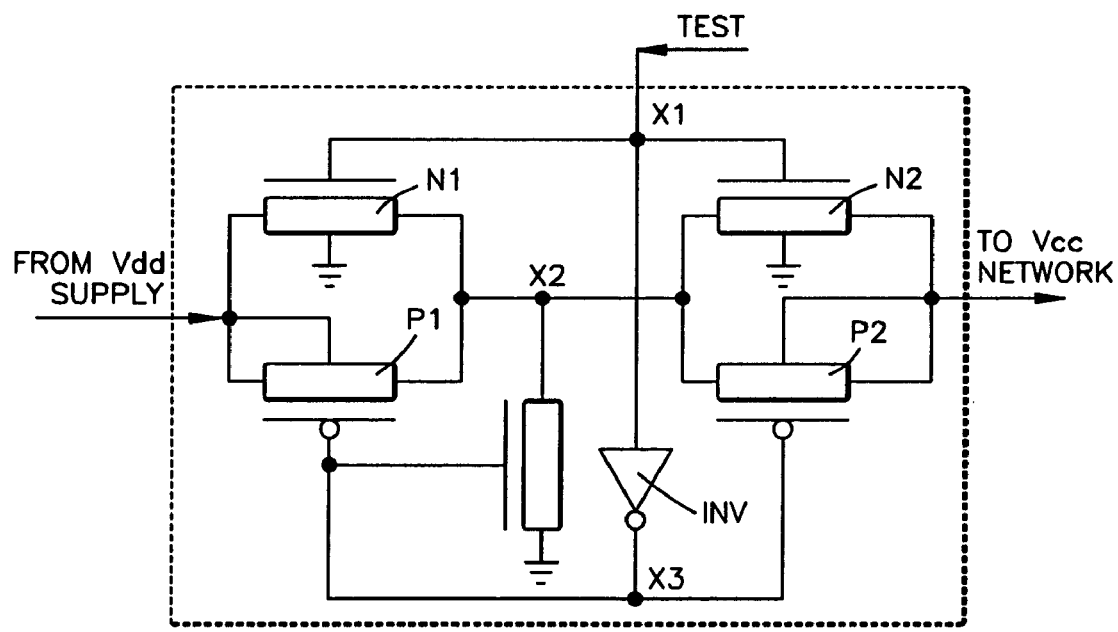

In the past, a conventional CMOS T-switch device of the type shown in FIGS. 4A and 4B might be used so that network 502 can borrow power supply from Vdd. In this case, a control device 503 is needed to provide a control signal on line 506 to the switch device 504. Both supplies, Vdd and Vcc, would be connected to the control device 503. The conventional CMOS switch device shown in FIG. 4A can be used as a switch device 504. In this case, assume that the level of Vdd and Vcc are identical, or Vdd=Vcc. A transmission gate formed by a pair of NMOS FETs, N1 and PMOS FETs, P1, connected in parallel, is used as the switch device 503. When the control signal "test" is asserted, the switch is turned on. The body of the PMOS device is tied to Vdd, while NMOS to ground. Both NMOS and PMOS have a certain "turn-on" resistance. To avoid voltage drop across the transmission gate, large device sizes are normally used. When control signal "test" is disengaged, the switch is turned "off". Since Vdd and Vcc are at the same level, there will be no leakage concern.

However, the challenge is when Vdd<Vcc; when switch is turned "off", any leakage between them is not desirable. An example of a CMOS switch to share Vdd when Vcc is absent is shown in FIG. 4B. In this design, two pairs of transmission gates are required. The first is formed by N1 and P1, with the body of P1 tied to Vdd. The second is formed by N2 and P2 with the body of the P2 tied to Vcc. This is because when Vcc is presented, the body of the P2 must be tied to the most positive voltage level or a forward biased junction will cause leakage Vcc to Vdd. A third device N3 is used to tie the intermediated node X2 to ground when the switch is turned off. It is readily apparent that voltage drop across two T-gates in serial plus guard rings to surround the devices to avoid latch up, etc. demands a much larger device size than the previous one of FIG. 4A.

The second embodiment is the use of a MEM switch to switch off unwanted or deactivated macros to thus isolate supply noise and cross-contamination between macros. At least one MEM switch can be used to switch "off" the power supply to each macro, so the leakage current, or Iddq of that macro can be measured. This technique can be used to detect and isolate faults caused by shorting.

The third embodiment is to use a MEM switch to perform pin reconfiguration. This feature is very powerful and useful especially when chip I/O numbers keep increasing. When a limited chip area cannot meet the I/O demand, many test functions or different operating modes must be abandoned. With reconfigurable pin scheme using at least one MEM switch, one can accommodate more testing features. After testing, the pins can be switched to power supply or other control or program pins to improve chip versatility.

Another feature of this invention provides a robust and more dynamic power distribution network using MEM switches. This includes four embodiments: (1) a power distribution network using at least one MEM switch array with power sensing device, so that power can be distributed more uniformly to all corners of the chip. When a local sensing circuit detects low supply limit, the switch is automatically turned on and maintained on; (2) a power switching device comprising a hierarchical MEM switch array which is able to switch "on/off" any specific local power supply of a system on chip; (3) any predetermined MEM switch or switch group can be turned off to shut down at least one portion of the unused chip to save power; (4) an algorithmic control of MEM switch array, where each MEM switch element is located at the cross-point of power supply, and is designed to ensure more uniform power supply. During an initial set-up mode, the embedded algorithm forces the system to run power supply uniformity calibration and set the switch network accordingly. Once the switch pattern is determined, the pattern is stored in a nonvolatile memory array which will remember the switch pattern and automatically set the MEM switch array during each power-on period.

The Embodiment Using a MEM Switch for Sharing Power Supply during Test Mode

It is possible that during wafer testing, a certain power supply level is not available. In this case, it is desirable to borrow adjacent power supply for temporary testing purposes to weed out bad chips at an early stage. As shown in FIG. 5, a first portion 501 of circuit 500 has a power supply network connecting to a valid supply source Vdd, while a second portion 502 of the circuit 500 has another power supply network connecting to a temporarily (during testing) unavailable supply source Vcc.

Therefore, according to this invention, a MEM switch 15 as shown in FIGS. 3A-3C is used for switch 504 shown in FIG. 5. During testing, the switch 504 is asserted, and there will be very little insertion loss. When the testing is over, the switch is disengaged and the virtually infinitive impedance insures essentially no leakage between two supplies with different voltage levels. Similarly, the same type of MEM switch can be used to isolate a portion of circuit macro from its supply. This is explained in the following:

Hierarchical MEM Switch Network for Flexible Power Control

To cope with the existing power mesh (or grid) in the power distribution network, a hierarchical MEM switch is utilized; that is, to embed MEM switches at different levels of power supply networks. Each MEM switch or a collection of MEM switches at any level can be turned "on" or "off" independently when power requirements dictate. This concept can be implemented on the chip as well as at package level. As depicted in FIG. 6, the last metal level 610 is connected to the next level metal 620 i (i=1 to N) via a group of switches 610S. Similarly, the next level of metal 620_1 is connected to the metal below 620 ij (where i=1 to N, and j=1 to M) via another group of switches 620 i jS, and so on. One can isolate a specific local circuit, e.g. 620_1_1_1 from the power supply by switching off multiple level switches, e.g. the first switch of switch groups 620_1_1 S, 620_1 S and 610S. For example, those circuits that are used once for a specific purpose, and then are not needed any more, can be isolated from the power supply to save power consumption. These include circuits used for power on, testing, calibration or periodic sampling, etc. This arrangement also can be used to isolate power supply between macros so that noise produced from one macro cannot be easily coupled to another.

Figure 7:
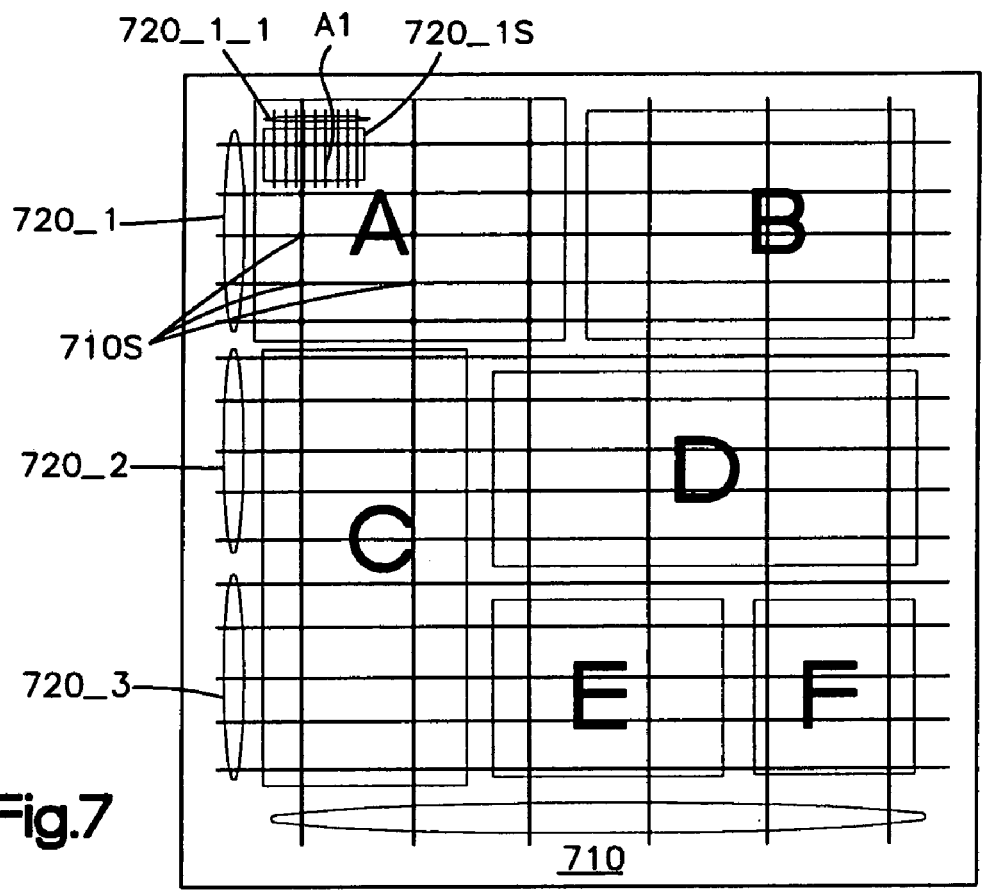
FIG. 7 shows MEM switches for selectively connecting and disconnecting circuit blocks.

An example shown in FIG. 7 shows how to disconnect power supply to circuit block A1 within macro A. In this SOC (system on a chip), there are many macros, A, B, C . . . F. Assuming that A1 is used for testing, and during normal operation, it can be disconnected from the supply to save power. In the hierarchical switch architecture, one can switch off a collection of 720_1 S switches located within the A1 area to disconnect 720_1_1 from 720_1. In order to isolate power supply noise cross-contamination between macros A and C, one dedicates the first vertical wire of 710 to C and second and third to A. To avoid power supply noise cross-coupled between C and D, one can assign part of horizontal wires from 720 2 to C and part to D and so on.

Figure 10:
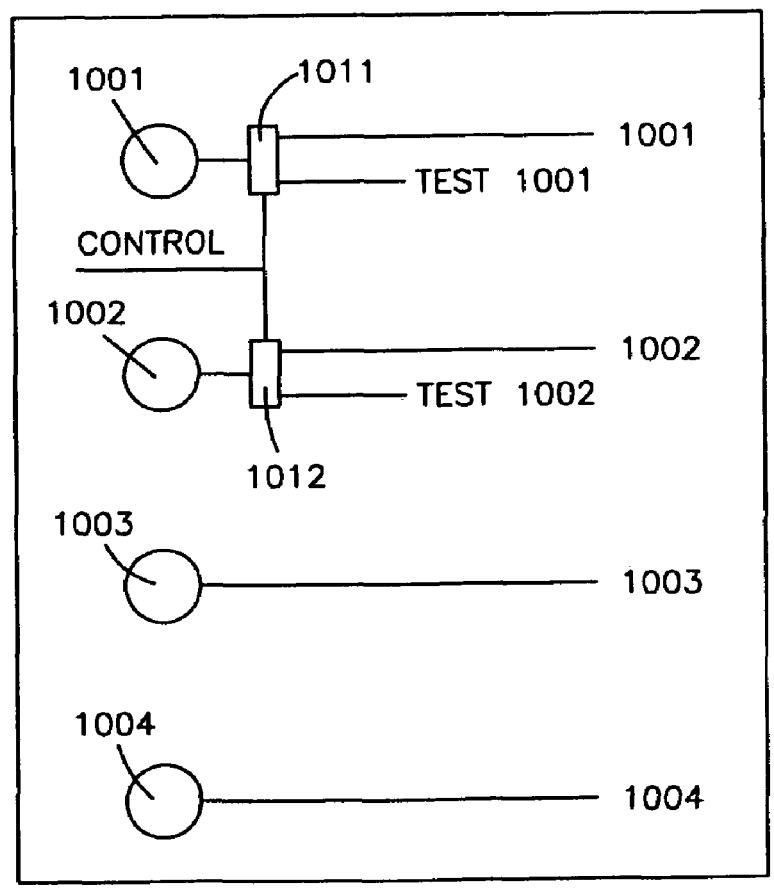
FIG. 10 shows MEM switches used for pin reconfiguration during testing.

Referring now to FIG. 10, in this example, four pins 1001, 1002, 1003, 1004 are shown. Among them, two pins 1001, 1002 are borrowed for testing purposes. Pin 1001 is used for test_1, and pin 1002 for test_2. This can be done by using two MEM switches 011, 012, and a control signal. In short, the control signal, then switches will connect test_1 to pin 1001 and test_2 to pin 1002. When in the normal operating mode, set control, the switches will connect normal_1 to pin 1001 and so on. This is called pin reconfiguration. No extra pins are needed for anything else other than normal operation.

Using MEM Switches to Improve Power Supply Uniformity

Figure 8:
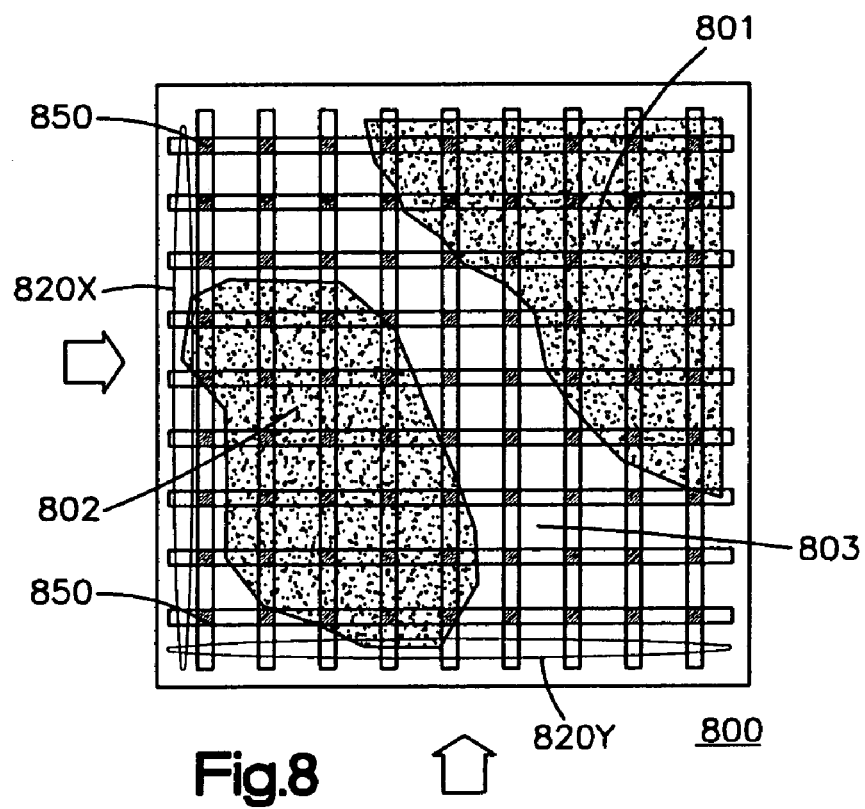
FIG. 8 shows MEM switches for distributing power supply to a chip.

It is always a challenge to distribute power supply uniformly across the chip. In today's IC chips comprising millions of devices, thousands of components perform numerous different functions. Depending on the operation mode, some portions of the chip may consume more power than others. To improve the uniformity of power distribution, a power mesh (or power grid) scheme is commonly adopted. As shown in FIG. 8, power mesh interconnect is comprised of a plurality of parallel conductive wires 820X traveling in horizontal direction (as depicted on the drawing) which is connected to a plurality of parallel conductive wires 820Y in another plane on the chip traveling in vertical direction (as depicted on the drawing). This arrangement can guarantee a certain degree of success if the following conditions are met: (1) power consumption of all the components is uniformly distributed across the chip; (2) power pins which allow the chip to be connected to the power source via package hardware are uniformly distributed. As those familiar in the field will understand, the ideal case would never occur in the real world. As a result, voltage drop (due to IR) from the supply source to the local circuit becomes unacceptable, especially when the supply level is further reduced with the non-stop technology down-scaling. In general, such an adverse effect has about the same impact to the high-speed analog circuit and digital circuits. The loss of head-room for common mode logic type of analog circuits has caused tail devices to operate in the linear region. This results in poor jitter performance.

To solve this problem, a dynamic power self-regulating distribution network is provided which utilizes MEM switches. Referring back to FIG. 8 again, an array of MEM switches are provided, at least one switch 850 is provided at each cross-point of a horizontal and a vertical power line (it will be remembered that these lines are on different levels). Each switch can be individually turned "on/off" based on control information. Such "power-supply-on-demand" switches ease the uneven power loading problem, assuming shaded zones 801 and 802 consume more power than clear area 803. Based on this concept, all the switches within the shaded areas are switches on, while some of the switches located in the clear areas axe turned off. The concept is to allow each switch device to determine whether it should be on or off based on local power demand. If local power level is detected to be lower than a preset level, then it will be turned on, or otherwise off. This is done during an initial power calibration mode.

For a large IC system, for example, system-on-chip, there will be many operating modes which may require different power distribution demand for different modes. For example, during the test mode, the test block and testing related circuit blocks and clock will be activated to perform test operations. One must make sure that power supply to these blocks is sufficient and supply to other areas may not be so important. During the sleep mode, maybe some blocks need to awaken to perform security or refresh operation. Therefore, only power supply switches to these areas should be turned on, and others can be shut off to save power. A look-up table in the form of a nonvolatile memory array can be used to store power switch receipts to be used for different operating modes. A software algorithm can be installed to choose a specific power switch pattern for a specific operation. This will significantly improve the power distribution uniformity. The switch-on blocks would suffer minimal supply IR drop, and the switch-off blocks would result in minimal power leakage.

Figure 9:
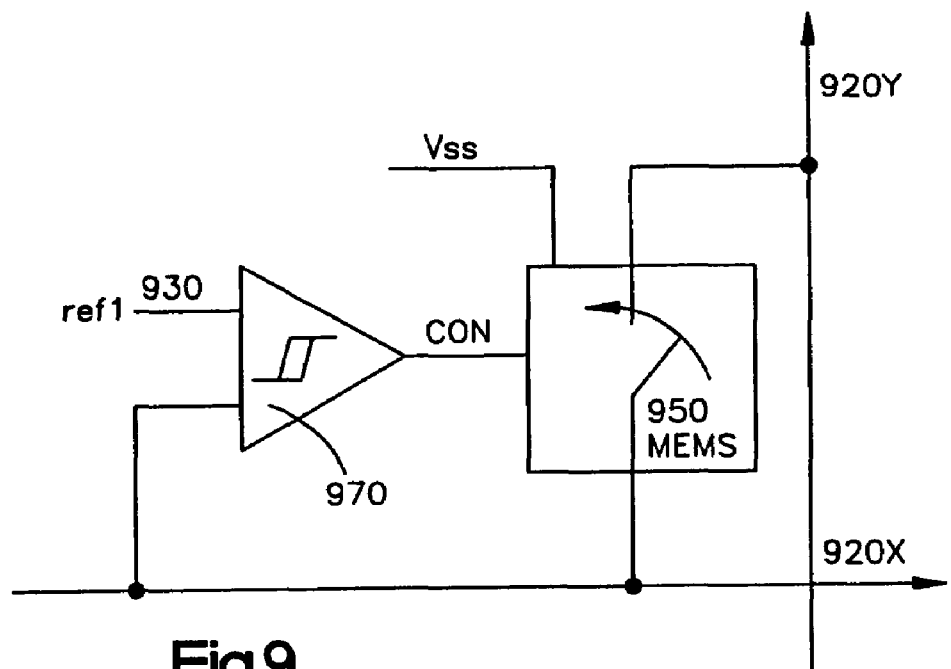
FIG. 9 shows MEM switches to control power supply to different blocks in a chip.

The detail of the switch circuit is described in FIG. 9. In order to avoid noise caused by switching of the power switches, one reference level is provided. That is, a predetermined reference low level 930 "ref 1" is fed to one leg of a hysteresis comparator 970. When local voltage is detected to be lower than ref 1, it will turn on the switch to connect the local power wire 920X—to a global wire 920Y. Once the switch is "on", it will remain "on". A pre-set hysteresis level is built-in to avoid any unnecessary switching activity. Here, the switch is a low-voltage and low-loss MEM switch. Without a proper hysteresis, noise due to frequent switching would be harmful to the chip performance.

Therefore, a power supply network employing such MEM switches is able to achieve the goal of uniform power supply distribution across the chip. The principle is, areas that consume more power will be fully connected to the supply line, while areas that consume less or no power will be partially connected or disconnected to the supply. This power-on-demand arrangement is more suitable for more sophisticated chips such as those with SOC (system on chip) designs.

Several arrangements of using hinge type switches for power network reconfiguration, such as (1) isolation, (2) sharing, and (3) optimizing power supply, are mentioned in this disclosure.

Figure 11:
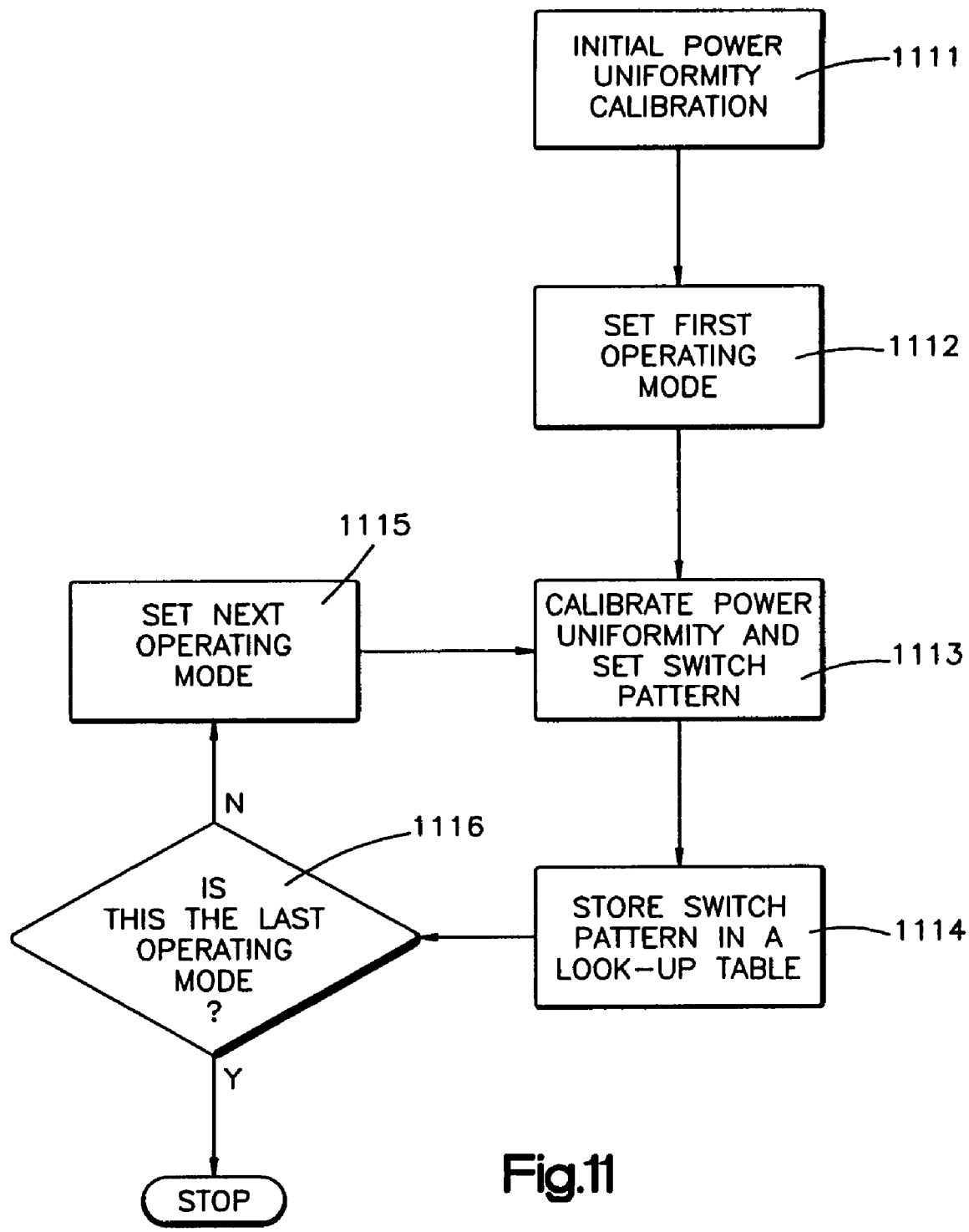
FIG. 11 is a flow diagram for calibrating and optimizing power supply uniformity.

An example of calibrating steps to optimize power supply uniformity and set MEM switch pattern is shown in FIG. 11. When the calibration stage begins 1111, the system will set all the parameters to the first operating mode 1112 and perform power uniformity calibration 1113. The local sensors will sense the voltage level and decide whether the switch should be turned "on" or remain "off". Once the setting is done, the setting information of each switch will be scanned out and loaded to a look-up table 1114. Once the setting of the first mode is done, the system will get ready to perform the repeated calibration for the next operating mode 1115, and store the switch pattern into the table. It proceeds until the last operating mode 1116 is finished. The switch patterns that are located inside the look up table can be fetched based on mode address and scanned into each switch point to set the switch array. This will guarantee the uniform power distribution for each operating mode.

Reconfiguration of Test Pins After Use in the Test Process to Supply Pins for the Product Application Pins are frequently required on an integrated circuit for test purposes which are left unused for the functional mode as they are no longer needed after the test. A MEM switch can be used to connect such a pin after test to a power supply, for example VDD or GND, when it has served its initial purpose during testing such that it can be reused as a supply pin. In this way, the pin is not left unused but can serve as a supply pin during the rest of the life of the device. The MEM switch is well suited for this application, having a high isolation when "off" such that it does not interfere with the test function and low resistance when thereby providing an effective power connection. The reconfiguration of the pin can occur on the tester after the initial purpose of the pin has been served. There are known technologies, such as eFuse or programmable memory, whereby the initially open MEM switch can be closed, thereby connecting the internal power connection within the integrated circuit to the pin. It follows that the technology that changed the state of the MEM switch and, therefore, the function of the pin, could be a one time operation or reconfigurable, depending on the application.

The Isolation of Circuits from the Supply

The provision of a MEM switch on the power grid also enables a circuit to be disconnected from the supply. This can be useful during modes of operation where the circuit might not be required. The provision of a MEM switch on the power grid also enables a circuit to be disconnected from the supply. This could be useful during modes of operation where the circuit might not be required; for example, 'sleep' modes in microprocessors where it is important to minimize current drain from the supply to prolong battery life. Conventional disable modes for circuits usually still result in leakage current across the supply for these disabled circuits and with sub micron processing technologies, this current can be significant. The high "off" resistance of a MEM switch provides a significant advantage in this application. Similarly, at chip test, a leakage current test otherwise known as Iddq test is often performed to screen for processing faults. The provision of a MEM power switch on individual circuits will allow these circuits to be included and excluded from the Iddq measurement and, in this way, faults can be traced to individual circuits.

Also, with decreasing process geometries and increasing device counts on integrated circuits, it is well known that the Iddq test is becoming less useful to detect faults as the leakage current on a good device approaches and exceeds the fault current on a failed circuit. This technique offers a technique of reducing the scale of extending the usefulness of the Iddq test by allowing sub-blocks to be added and removed from the circuit reducing the scale of the leakage test and also allowing detected faults to be traced to the sub block level.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A power distribution network of an IC chip comprising:
   a first group of parallel power lines, and a second group of parallel power lines, wherein said first group of power lines transverse orthogonal to said second group of power lines;
   an array of MEM (microelectricalmechanical) switches between said two groups of power lines having one MEM switch located at each cross-point of said two transverse power lines;
   a MEM switch control signal is provided for each MEM switch to control "on/off" of the respective MEM switch;
   a look-up table of the current demand for the various sub-systems on the chip for a selected series of system modes and operating conditions; and
   a comparison engine to compare the system state and its associated current demand to that for the system configuration and active processes being used at the time.

2. The invention as defined in claim 1 wherein a predetermined set of MEM (microelectricalmechanical) switches are closed or opened, depending upon the comparison between the stored system state and the operating conditions at the time to maintain power grid accuracy without active voltage measurement.

3. The invention as defined in claim 2 wherein said comparison between the stored system state and the operating conditions may be augmented by comparison to a "high" voltage reference level which is a predetermined maximum local power supply voltage level if another dimension of control is required.

4. The invention as defined in claim 2 wherein said comparison between the stored system state and the operating conditions may be augmented by comparison to a "low" voltage reference level which is a predetermined minimum local power supply voltage level if another dimension of control is required.

5. The invention as defined in claim 1 wherein at least one MEM switch has a calibration structure associated therewith.

6. The invention as defined in claim 1 wherein there are a plurality of connection pins in said network, and wherein at least one of said pins has a MEM (microelectricalmechanical) switch associated therewith to reconfigure said at least one pin.

7. The invention of claim 6 wherein there are a plurality of MEM (microelectricalmechanical) switches, each associated with a pin for reconfiguration.

* * * * *